310-334 SR
OR 4,017,751 T 9213

United States [Patent] 4,017,751
Desormiere et al. Apr. 12, 1977

[54] ELASTIC VOLUME WAVE CONVOLUTION DEVICE

[75] Inventors: Bernard Desormiere; Edouard Bridoux, both of Paris, France

[73] Assignee: Thomson-CSF, Paris, France

[22] Filed: Dec. 15, 1975

[21] Appl. No.: 640,563

[30] Foreign Application Priority Data

Dec. 17, 1974 France ......................... 74.4141521

[52] U.S. Cl. ................................ 310/8.1; 235/181; 330/5.5

[51] Int. Cl.[2] ......................................... H01L 41/04

[58] Field of Search ...................... 310/8.1, 9.5, 9.8; 333/30 R; 235/197, 181; 324/77 G; 332/26; 330/5.5

[56] References Cited

UNITED STATES PATENTS

| | | | |
|---|---|---|---|
| 3,406,350 | 10/1968 | Newell | 333/30 R |
| 3,536,506 | 10/1970 | Fraser | 333/30 R |
| 3,668,568 | 6/1972 | Morgenthaler | 310/9.5 X |
| 3,760,172 | 9/1973 | Quate | 310/8.1 X |
| 3,771,073 | 11/1973 | Krause et al. | 333/30 R |
| 3,899,666 | 8/1975 | Bolger | 235/181 |

*Primary Examiner*—Mark O. Budd
*Attorney, Agent, or Firm*—Cushman, Darby & Cushman

[57] ABSTRACT

The invention relates to a device which forms the product of convolution of two signals available in electrical form. This device consists of a substrate of lead molybdate in which there are created, at the two ends, volume elastic waves, which are longitudinal and transverse respectively for each of the two applied signals. The non-linear interaction of these waves produces an elastic wave of transverse mode, representing the product of convolution of the two signals.

4 Claims, 5 Drawing Figures

ELASTIC VOLUME WAVE CONVOLUTION DEVICE

The present invention relates to information processing using elastic waves, and has more particularly for its object to provide a device for forming the product of convolution of two signals available in electrical form.

Various devices for producing such a function are already known; they generally utilise a piezoelectric material, on the surface of which elastic waves travel, the wave resulting from the non-linear interaction of these waves representing the desired product. These devices have various disadvantages, of which there may be mentioned the very necessity to use a piezoelectric material, the low effectiveness of the non-linear interactions in piezoelectric materials and, consequently, the necessity to employ relatively high powers, and again the narrowness of the pass band of such devices, associated with the use of surface waves.

The present invention has for its object to provide a convolution device by means of which it is possible to avoid the aforesaid limitations. To this end, it utilises the propagation, in a non-piezoelectric substrate, of elastic volume waves, preferably longitudinal and transverse respectively, corresponding to the two applied signals, and the non-linear interaction of these two waves which produces a resultant elastic wave of the transverse type, representing the product of convolution of the two applied signals.

According to the invention, there is provided an elastic wave device for the convolution of a first and a second electric signal comprising a non piezoelectric substrate, first and second electromechanical transducer means located on said substrate adapted for respectively receiving a first carrier wave modulated by said first electric signal and a second carrier wave modulated by said second electric signal and for producing in said substrate respectively transverse and longitudinal volume elastic waves propagating along a same axis for creating in said substrate a transverse resultant elastic wave, and further electromechanical transducer means located on said substrate adapted for transforming said resultant elastic wave in carrier wave modulated by an electric signal which represents, with time compression, the convolution product of said first and second electric signals.

For a better understanding of the invention and to show how the same may be carried into effect, reference will be made to the following description and the attached drawings among which:

FIG. 1 diagrammatically illustrates one form of construction of the device according to the invention;

Figure 1:
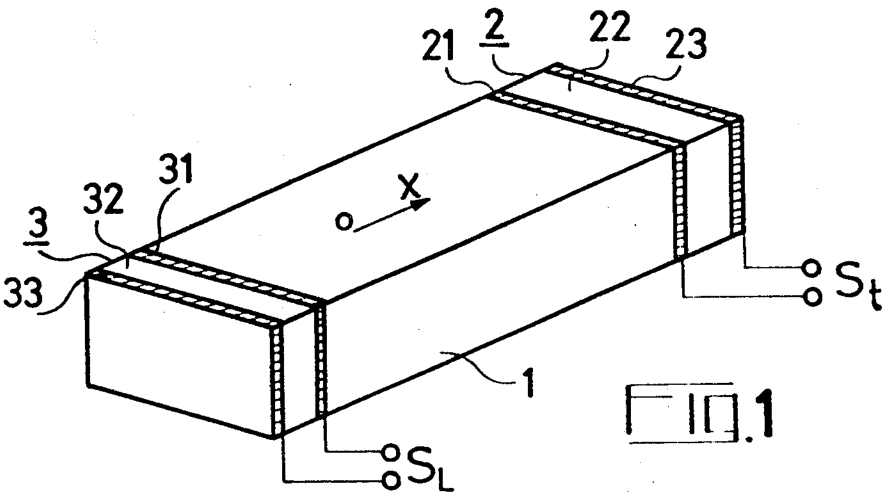

In these drawings, the device and the signals are drawn to an arbitrary scale, which is generally enlarged for the sake of the clarity of the drawing.

In FIG. 1, there is illustrated a substrate 1 in which elastic waves, can travel and electromechanical transducers 2 and 3 respectively on either side of the substrate 1.

The substrate 1 is made of a non-piezoelectric material having very non-linear behaviour, that is to say, having a high output for the non-linear interactions of elastic waves. In a preferred embodiment, the material is lead molybate.

The transducer 2 is composed of two electrodes 21 and 23, between which a layer 22 of piezoelectric material, such as lithium niobate, is located, the cutting axes of which, in relation to the crystallographic axes and the thickness being so chosen that the transducer 22 emits, under the action of a signal $S_t$ applied between the electrodes 21 and 23, volume elastic waves of the transverse mode, that is to say shear vibrational agitations. To this end, the thickness of the piezoelectric layer 22 is equal to a half-wavelength ($\lambda_{t/2}$) of the carrier transverse waves, or a multiple thereof.

Figure 2:
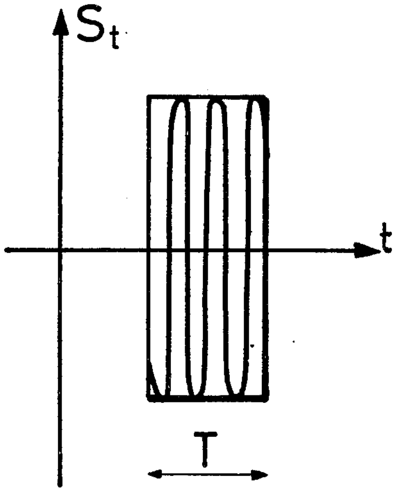

An example of the form of the signal $S_t$ applied to the first transducer is given in FIG. 2, this signal being a sinusoidal carrier signal of pulsation $\omega_t$ modulated by a rectangular waveform of width T. One of the electrodes (21 in FIG. 1) of the transducer 2 (which electrode may consist, for example, of indium-containing solder) is applied on one face of the substrate 1, the transverse elastic wave which corresponds to the signal $S_t$, and which will also be called $S_t$ for the sake of simplicity, travelling in the substrate 1 in a direction indicated by an axis $\vec{Ox}$, but in the opposite direction to the said axis.

The transducer 3 is advantageously of the same type, that is to say, it consists of two electrodes 31 and 33, between which a layer 32 of piezoelectric material, such as lithium niobate is situated. The thickness and the cutting axes (with respect to the crystallographic axes) of the latter layer are so chosen that the transducer creates volume elastic waves of the longitudinal mode, that is to say, compressional vibrational agitations, under the action of an electric signal $S_L$ applied between the electrodes 31 and 33.

For this purpose, the width of the layer 32 is made equal to a half-wavelength ($\lambda_{L/2}$) of the longitudinal carrier wave, or to a multiple of the latter.

One of the electrodes (31 in the figure) is applied to a face of the substrate 1, opposite to that which bears the transducer 2, in order that there may travel in the substrate along the axis $\vec{Ox}$ a longitudinal elastic wave representing the signal $S_L$, and called $S_L$ for the sake of simplicity.

Figure 3:
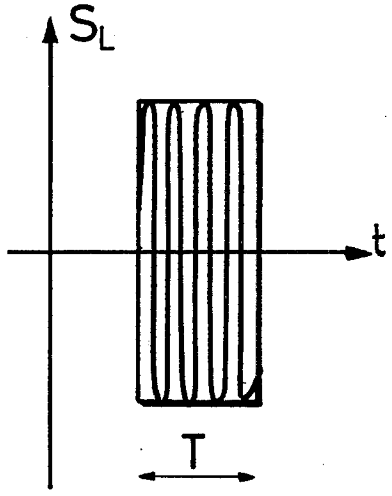
FIGS. 2, 3 and 4 illustrate examples of signals applied and supplied by the device according to the invention.

FIG. 3 illustrates an example of the form which may be taken by the signal $S_L$, that is to say, a sinusoidal carrier signal of pulsation $\omega_L$ modulated in the form of a rectangular pulse whose width is, for example, made equal to that of the signal $S_t$ (T).

In operation, the signals $S_L$ and $S_t$ are applied respectively to the transducers 3 and 2, and at the end of a time depending upon their respective speeds of propagation, the corresponding elastic waves interact in non-linear manner so as to induce a further elastic wave. If the pulsation and the wave vector of the longitudinal wave are denoted by $\omega_L$ and $\vec{k_L}$ respectively, and the same quantities for the transverse wave are represented by $\omega_t$ and $k_t$, while these quantities for the resultant wave are represented by $\Omega$ and $\vec{K}$, propagation equations give:

$$\Omega = \omega_L \pm \omega_t$$

$$\vec{K} = \vec{k_L} \pm \vec{k_t}$$

Calculation shows that only the wave corresponding to the difference of the terms is capable of propagating; this is a wave S of transverse type, which thus has the following pulsation:

$$\Omega = \omega_L - \omega_t \qquad \text{(a)}$$

and has as its wave vector: $K = \vec{k_L} - \vec{k_t}$ or, in wave number: $K = k_L + k_t$ (b), if the ratio of the pulsations $\omega_L/\omega_t$ is equal to 2 $v_L/v_L - v_t$ where $v_L$ et $v_t$ are the respective speeds of longitudinal and transverse waves.

Figure 5:
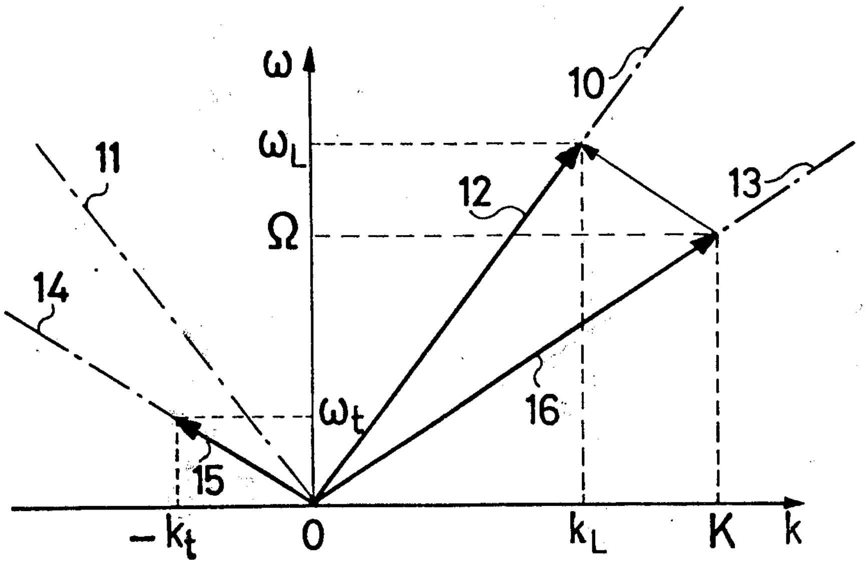
FIG. 5 is an explanatory diagram.

FIG. 5 shows vectors characteristic of the waves propagating in a plane where the abscissa are the pulsations $\omega$ and the ordinates are the wave numbers $k$ of the waves propagating in the substrate 1, on which vectors 12, 15 and 16 represent the waves $S_L$, $S_t$ and S respectively.

The extremity of the vector 12, of abscissa $k_L$ and ordinate $\omega_L$, is plotted along a line 10 of slope $v_L$, the velocity of travel of these waves in the substrate.

There is also shown a straight line 11 symmetrical with the line 10 about the axis $\vec{O\omega}$ of the ordinates, representing the longitudinal waves travelling in the direction $-\vec{Ox}$.

The extremity of the vector 15, of abscissa $-k_t$ and of ordinate $\omega_t$, is plotted along a line 14 of slope $v_t$, velocity of travel of the transverse waves travelling in the substrate in the direction $-\vec{Ox}$.

The expressions (a) and (b) gives, in the plane $(k,\omega)$, the coordinates of the point which represents the transverse resultant wave, this point is the extremity of the vector 16; it has as its abscissa $K = k_L + k_t$ and as its ordinate $\Omega = \omega_L - \omega_t$; it is plotted along a line 13, symmetrical with the line 14 about the ordinates, which represents the transverse waves travelling in the direction $+\vec{Ox}$. The wave S therefore travels back towards the transverse-wave transducer 2, and an electric signal representing the wave S can thus be obtained at the terminals of the said transducer.

Figure 4:
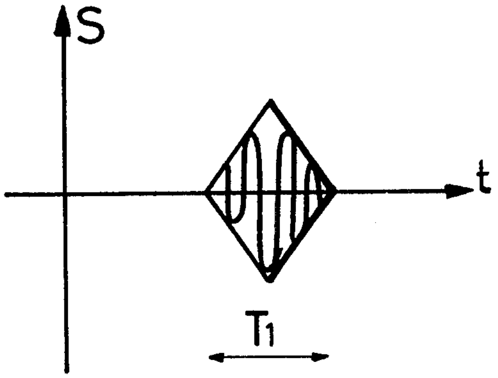

Calculation shows that the amplitude A of the modulated wave S, which is the solution of the propagation equation of the non-linear wave, is of the form:

$$A = C_1 \cdot \int_{-\infty}^{+\infty} A_L(\tau') \cdot A_t(\tau) \cdot d\tau \qquad (1)$$

with : $\tau = t + \frac{x}{v_t}$ $$\tau' = \alpha(t + \Delta t) - \tau$$

constant, A, $A_L$ and $A_t$ are the amplitudes of the waves S, $S_L$ and $S_t$, $C_1$ is a contant, $\alpha$ is the compression factor of the time equal to $(1 + (v_L/v_t)$ and $\Delta t$ is the delay in the production of the wave S in relation to the waves $S_L$ and $S_t$, equal to $L/v_L + v_t$ if L is the length of the substrate. The expression (1) shows that the wave S represents, to within a proportionality factor, the product of convolution of the two applied modulating signals, with a compression of the time scale ($\alpha$). The form obtained for the signal S, in the particular case of the signals $S_L$ and $S_t$ represented in FIGS. 3 and 2, is given in FIG. 4; it is a sinusoidal carrier wave of pulsation $\Omega$ modulated in triangular form whose base is $T_1 = 2T/\alpha$, which is offset on the time axis by $\Delta t$ in relation to the instant of emission of $S_L$ and $S_t$.

As mentioned in the foregoing, such a convolution device has various advantages, some of which are associated with the use of a material such as lead molybdate to form the interaction medium. If P is the electric power of the convolution signal S obtained, and $P_L$ and $P_t$ the electric powers of the signals $S_L$ and $S_t$ respectively, we have:

$$P = C.P_L.P_t$$

Now C, which is generally called the bilinearity factor, has a very high value for lead molybdate as compared with the standard values for piezoelectric materials.

A first consequence of this property is a high effectiveness of the described non-linear interaction.

A second consequence thereof is a large dynamic range of operation, because the effectiveness of a non-linear interaction increases with the applied powers, and in the case of materials having a low factor C, this consideration sets a relatively high lower limit on the utilisable powers.

In addition, the utilisation of interactions between volume waves makes it possible to overcome certain technological difficulties which limit the pass band of the device. Notably, since the pass band varies in the same sense as the frequency, a device operating with surface elastic waves is limited in its pass band by reason of the difficulty in producing a transducer for surface elastic waves at very high frequency.

The invention is not limited to the description given in the foregoing by way of non-limiting example. Thus, the invention also includes variants in which the electromechanical transducers of FIG. 1, for example, are not both so arranged as to emit colinearly in a common direction O$x$, but one of the two or both are so arranged as to emit in a direction which is at an angle between 0° and 90° to the axis O$x$. Moreover, they may either each be disposed at one end of the substrate or both at the same end of the substrate. Finally, the transverse wave produced by the interaction need not be picked up by one of the emission transducers, but by a third transducer.

What we claim:

1. An elastic volume wave device for the convolution of a first and a second electric signal comprising a non piezoelectric substrate having two ends, first and second electromechanical transducer means located on said substrate adapted for respectively receiving a first carrier-wave modulated by said first electric signal and a second carrier wave modulated by said second electric signal and for producing in said substrate respectively transverse and longitudinal volume elastic waves propagating along a same axis for creating in said substrate a transverse resultant elastic wave travelling back to said first electromechanical transducer means adapted for transforming said resultant elastic-wave into a carrier wave modulated by an electric signal which represents, with time compression, the convolution product of said first and second electric signals.

2. An elastic volume wave device as claimed in claim 1, wherein said first transducer means comprise one electromechanical transducer for emitting and receiving transverse elastic waves, comprising two electrodes between which and in contact with which a layer of a piezoelectric material is located, said layer having a width equal to $n\ \lambda_t/2$ where $\lambda_t$ is the wavelength of the transverse carrier wave $y$ associated and $n$ is an integer, one of the electrodes being in mechanical contact with the substrate; and wherein said second transducer means comprise one electromechanical transducer for emitting a longitudinal elastic wave, comprising two electrodes between which and in contact with which a layer of a piezoelectric material is located, said layer having a width equal to $n\ \lambda_1/2$, where $\lambda_1$ is the wavelength of the longitudinal wave and $n$ an integer, one of the said electrodes being in mechanical contact with the substrate.

3. An elastic volume wave device as claimed in claim 1, wherein said transducers are respectively located at said two ends of the substrate, said transducers emitting elastic waves, which are transverse and longitudinal respectively, in a common direction, but one in the opposite sense to the other.

4. An elastic volume wave device as claimed in claim 1 wherein said substrate is made of lead molybdate.

* * * * *